United States Patent [19]

Tasch, Jr.

[11] Patent Number: 4,763,181
[45] Date of Patent: Aug. 9, 1988

[54] HIGH DENSITY NON-CHARGE-SENSING DRAM CELL

[75] Inventor: Al F. Tasch, Jr., Austin, Tex.

[73] Assignee: Motorola, Inc., Schaumburg, Ill.

[21] Appl. No.: 938,913

[22] Filed: Dec. 8, 1986

[51] Int. Cl.[4] ............................................. H01L 29/78
[52] U.S. Cl. ..................................... 357/23.6; 357/22; 357/54; 365/185
[58] Field of Search ........................................ 357/54

[56] References Cited

U.S. PATENT DOCUMENTS

| | | | |
|---|---|---|---|
| 4,417,325 | 11/1983 | Harari | 357/22 |
| 4,448,400 | 5/1984 | Harari | 357/23.6 |
| 4,612,629 | 9/1986 | Harari | 357/23.6 |

*Primary Examiner*—Robert S. Macon
*Attorney, Agent, or Firm*—John A. Fisher; Jeffrey Van Myers; David L. Mossman

[57] ABSTRACT

A non-charge-sensing high density dynamic random access memory (DRAM) cell using a trench capacitor as a vertical FET and two active field effect transistors (FETs). A particular bit line is shared by the cells on either side of it; the bit line on one side of a particular cell being used to write to the cell while the bit line on the other side of the cell is used to read from the cell. This dual use of bit lines, plus the use of a vertical FET transistor along one side of a trench capacitor, plus the avoidance for the need of a relatively large storage capacitor since the cell is not read by "dumping" or releasing its charge onto the bit line all aid in making this cell compact and suitable for high density memories. Since the substrate serves as the second source/drain region of the vertical FET, a separate line for this region is eliminated, also contributing substantially to a smaller cell size.

17 Claims, 3 Drawing Sheets

HIGH DENSITY NON-CHARGE-SENSING DRAM CELL

FIELD OF THE INVENTION

The invention relates to the structure of dynamic random access memory (DRAM) cells, and more particularly relates to high density DRAM cells that do not depend upon sensing stored charge by releasing the charge onto a bit line.

BACKGROUND OF THE INVENTION

Conventional DRAMs all use a variant of the basic one-transistor cell. The cell contents are read by sensing the charge stored on the capacitor in the one-transistor cell. That is, the charge in the capacitor is released onto the bit line, thus changing its voltage and causing the sense amplifier on the bit line to latch to a "1" or a "0" depending on the absence or presence of a charge on the capacitor. Thus, it is critically important to design the DRAM cell with adequate capacitance in order to achieve sufficient signal size.

The latest efforts toward this end include approaches utilizing "trench" capacitors and other techniques which result in more capacitance per unit area and also more process complexity. Also, considerable pressure is being put on the development of extremely thin capacitor dielectrics, on the order of 85 to 100 angstroms thin, in order to increase the capacitance per unit area.

Recently, a number of "inverted" type of trench capacitor cells have been reported. The term "inverted" is used to indicate that the electrode inside of the trench serves as the storage node, and the substrate surrounding the trench serves as the plate electrode. These approaches allow higher density, better refresh capability and better immunity to soft errors. However, they still depend on sensing a finite, small quantity of stored charge on a bit line with considerably larger total capacitance.

For example, M. Sakamoto, et al. in "Buried Storage Electrode (BSE) Cell for Megabit DRAMs," *Proceedings of IEDM,* 1985, pp. 710–713 describe a one-transistor, one-capacitor metal-oxide-semiconductor (MOS) memory cell wherein a buried polysilicon electrode refilled into a capacitor trench and connected to a transfer MOSFET electrode serves to store the signal charge, while the heavily doped substrate of a p/p++ epitaxial wafer serves as the capacitor plate. A one-transistor DRAM cell where both the transistor and the capacitor are fabricated on the sidewalls of a deep trench is described by W. F. Richardson, et al. in "A Trench Transistor Cross-Point DRAM Cell," *Proceedings of IEDM,* 1985, pp. 714–717. The charge storage node in the capacitor is primarily oxide isolated, thereby minimizing charge loss due to junction leakage and ionizing radiation. Since the capacitor is entirely contained in a single trench geometry, the capacitor is self-isolated, and there are no possibilities of parasitic sidewall transistors.

Finally, N. Lu, et al. in "The SPT Cell—A New Substrate-Plate Trench Cell for DRAMs," *Proceedings of IEDM,* 1985, pp. 771–772 relate that this cell is also superior to previously reported trench cells because the storage device is inside the trench, and the transfer device is fabricated in an n well. The p-channel one-device cell is formed with a trench capacitor which extends from the planar surface through the well and epitaxial layer into the heavily doped substrate. A conducting strap connects the polysilicon inside the trench to the associated source/drain of the transfer device. The authors recognize that the cell contains a vertical parasitic FET device where the source is the surface diffusion connecting the storage node to the transfer device, the drain is the substrate and the gate is the polysilicon-filled trench. This p-channel device will always have its gate and source connected and will not conduct if the threshold is sufficiently negative, which was achieved by using an n-well bias greater than the maximum stored voltage and the introduction of a retrograde well.

However, these devices retain the disadvantages of one-transistor memory cells in that the capacitor charge must be released onto the bit line to read the contents of the cell, and as a consequence maximizing the capacitance is a major issue in designing the cell.

A DRAM cell was reported in 1970 by W. M. Regitz, et al. in "Three-Transistor-Cell 1024-Bit 500-ns MOS RAM," *IEEE Journal of Solid-State Circuits,* Vol. SC-5, No. 5, October 1970, pp. 181–186, in which the charge on the capacitor was not dumped onto the bit line when reading the contents of the cell. Rather, the capacitor also served as the gate of another transistor, and the contents of the cell were read by sensing whether this transistor was turned on or off. This cell concept overcomes the disadvantage described in the previous paragraph for the one-transistor cell. However, at the time that this cell was reported, it was necessary to fabricate all elements (transistor, capacitors, etc.) of the cell on the surface of the silicon substrate. The resulting size of the cell rendered it unattractive for use in products because its area was substantially larger than the area of one-transistor cells.

SUMMARY OF THE INVENTION

Accordingly, it is an object of the present invention to provide a high density DRAM cell that does not read the contents of the cell by releasing the charge onto the bit line and then sensing the difference in charge on the bit line.

Another object of the present invention is to provide a high density DRAM cell whose state can be determined by other than stored charge sensing that still uses a minimum of substrate area.

It is another object of the present invention to provide a high density non-charge-sensing DRAM cell that does not require extra-ordinary means to maximize capacitance of the storage capacitor nor requires ultra thin dielectrics.

In carrying out these and other objects of the invention, there is provided, in one form, Aanon-charge-sensing dynamic random access memory (DRAM) cell in a semiconductor substrate having a region of buried dopant within the substrate. A vertical trench capacitor extends into the substrate and contacts the region of buried dopant. The trench capacitor has a trench wall forming a first plate electrode of the trench capacitor, a thin dielectric film covering the trench wall leaving a narrowed trench, and a first gate electrode of conductive material filling the narrowed trench and forming a second plate electrode of the trench capacitor. Also present is a first lateral field effect transistor (FET) in the substrate, the first lateral FET having first and second source/drain regions spaced apart from each other by a channel region which is covered by a second gate electrode insulated from the channel region, the first gate electrode of the trench capacitor being in electrical contact with the first source/drain region of the lateral FET. Further, there also exists a second lateral FET adjacent the vertical trench capacitor, but spaced apart from the first lateral FET, the second lateral FET having a first source/drain region along the trench wall of the vertical trench capacitor and a second source/drain region in the substrate separated from each other by a channel region covered by a third gate electrode insulated from the channel. The final element in the DRAM cell is a vertical FET on the trench wall of the capacitor adjacent the second lateral FET, the channel of the second lateral FET comprising a first source/drain region of the vertical FET, the first source/drain region of the second lateral FET comprising a channel of the vertical FET and the region of buried dopant comprising a second source/drain region of the vertical FET, wherein the first gate electrode comprises the gate electrode of the vertical FET separated from the channel by the thin dielectric film covering the trench wall.

DETAILED DESCRIPTION OF THE INVENTION

The invention utilizes an "inverted" type trench capacitor approach as do some prior DRAM cells; however, the capacitor of this invention actually and intentionally serves as the gate electrode of a vertical transistor to form one of the transistors in a three-transistor DRAM cell. Because of these features, it is not necessary to achieve a maximum capacitance per unit area in the capacitor, because the stored charge is not going to be "dumped" or released onto the bit line to sense the memory cell contents as is done in the conventional one-transistor cell.

Figure 1:
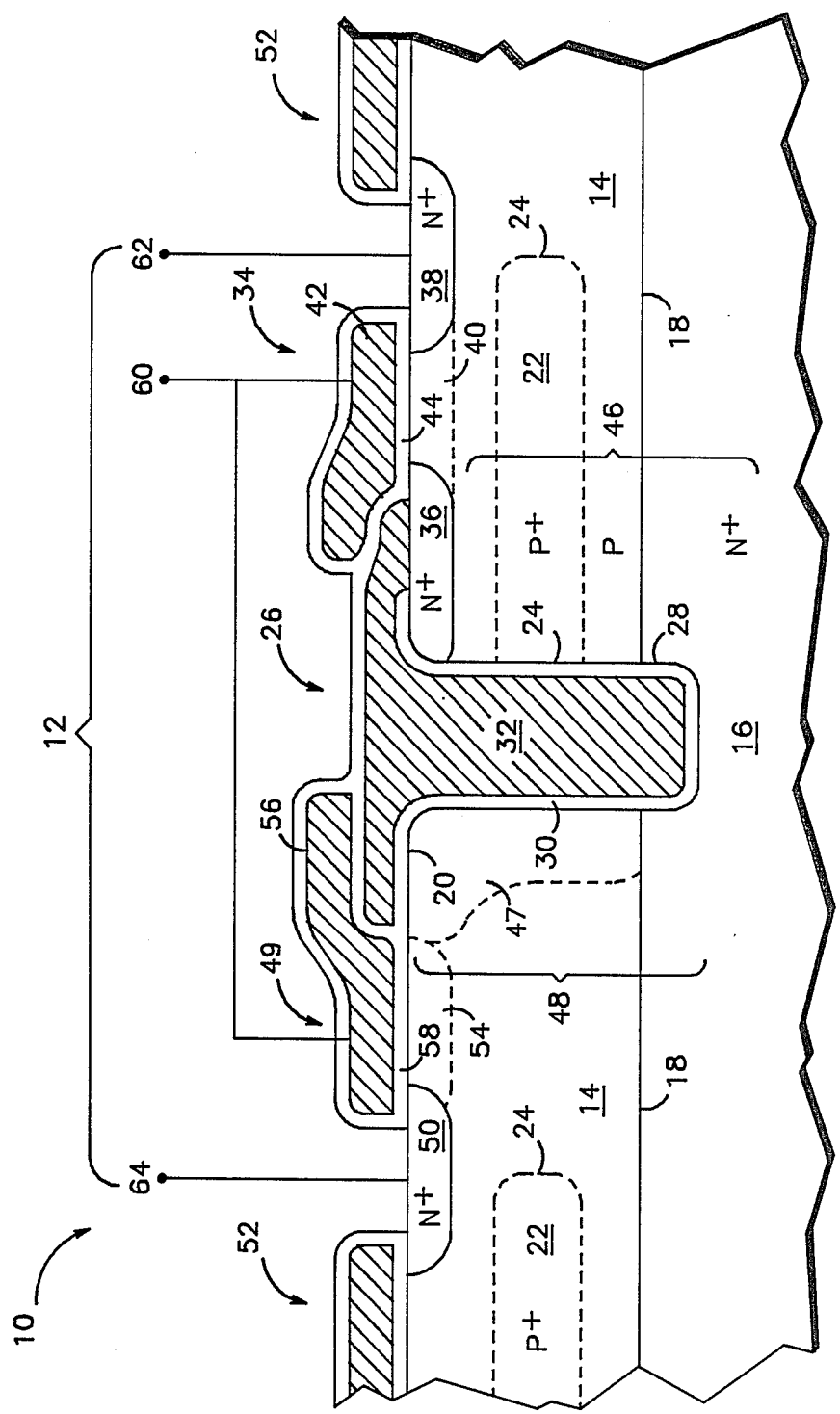
FIG. 1 is a cross section illustration of the high density non-charge-sensing DRAM cell of the present invention wherein the various device features are not to scale for clarity of understanding.

Shown in FIG. 1 is a cross section of an embodiment of the invention in which the high density memory array 10 is composed of a plurality of non-charge-sensing DRAM cells 12 formed in a layer 14, which may be a p-well in the N-type wafer, a p-well in a N− epitaxial layer on an N-type wafer or a P epitaxial layer 14 in a P/N+ epi wafer, where the semiconductor substrate 16 is N+ doped semiconductor material, or other combination. It is realized that the conductivity types of the regions of the cell may be reversed and a workable cell would yet be obtained. Also, while semiconductor substrate 16 and epitaxial layer 14 may be considered to be monocrystalline silicon for the purposes of illustration in this discussion, other semiconductor materials may also be suitable in the construction of this device.

Layer 14 has an interface 18 with the substrate 16 and a top surface 20 opposite the interface 18. Within layer 14, which is p-impurity doped in this particular illustration, is an implant region 22 of the p-impurity type, in one embodiment more heavily doped than the p-type layer. Implant region 22 is positioned vertically at some point between top surface 20 and interface 18. Its exact position should be determined by the device engineer. Implant region 22 also has a limited lateral extent, which is to say that it is not formed by a blanket implant but is selectively implanted as through a mask or other means. The lateral limit of implant region 22 is perimeter edge 24. As shown in FIG. 1, there is an implant region 22 beneath each DRAM cell 12, the implant region 22 of an adjacent cell 12 being partially shown.

Within P-layer 14 is a trench capacitor 26 in each cell 12, where the capacitor 26 has a trench wall 28 which forms a first plate electrode of the capacitor 26. Trench wall 28 also intersects the perimeter edge 24 of the implant region 22 for the particular cell 12. Capacitor 26 also has a thin dielectric film 30 covering the trench wall 28 which forms a narrowed trench within the trench wall 28. The last element of capacitor 26 is first gate electrode 32 which fills the narrowed trench and serves as the second plate of the trench capacitor 26 as well as gate electrode of vertical field effect transistors (FETs) to be described later.

Also present is lateral transistor 34 in layer 14, where transistor 34 is positioned over the implant region 22 and has first source/drain region 36 and second source/drain region 38 spaced apart from each other by lateral channel region 40 which is covered by a second gate electrode 42 insulated from the channel region by lateral transistor gate dielectric layer 44. Note that the term second gate electrode 42 is used to mean the second gate electrode of the cell 12, not the second gate electrode of the lateral FET 34 in the sense FET 34 might have two gate electrodes. Note also that first gate electrode 32 of the trench capacitor 26 is electrically connected with the first source/drain region 36 of the lateral transistor 34, through a buried contact.

As suggested earlier, cell 12 has two other FETs which are vertically oriented. First vertical FET 46 in layer 14 exists along the right side of trench capacitor 26 as seen in FIG. 1. The first source/drain region 36 of lateral FET 34 serves as the first source/drain region of the vertical FET 36, and the N+ semiconductor substrate 16 serves as the second source/drain region of first vertical FET 46. Note that in this structure 12 the first gate electrode 32 of the trench capacitor 26 is permanently tied to the first source/drain region 36 of the vertical FET 46, and also that implant region 22 prevents vertical FET 46 from turning on using the right trench wall 28 as a channel, thereby permanently keeping vertical FET 46 turned off.

Second vertical FET 48 exists in layer 14 along a side of trench capacitor 26 that does not contact implant region 22 so that FET 48 may be turned on and off. Second vertical FET 48 employs the channel region 54 of the lateral FET 49 as its first source/drain region and the semiconductor substrate 16 serves as the second source/drain region of the second vertical FET 48. The second vertical FET first source/drain region 54 and second vertical FET second source/drain region 16 are separated from each other by second vertical FET channel 47 which is covered by the first gate electrode 32 insulated from channel 47 by gate dielectric 30.

A second lateral FET 49 has region 47 as its first source/drain region, which it shares with second vertical FET 48, and impurity region 50 as its second source/drain region, with second lateral FET channel 54 beneath third gate electrode 56. It is perhaps more accurate to think of second vertical FET 48 and second lateral FET 49 as one transistor with a single pair of source/drain regions 16 and 50 with a divided channel region 47 and 54 controlled by two separate gate electrodes 32 and 56, respectively.

In operation, the first gate electrode 32 is charged positively or held low by turning on the first word line 60 tied to second gate electrode 42 and third gate electrode 56, and bringing the first bit line 62 high (positive voltage) or low (at or near ground), depending on the absence or presence of the desired bit. This procedure is the same as writing into a conventional one-transistor cell. The N+ substrate 16 is held at ground, and second bit line 64 is held at or near ground (low). In order to avoid the first vertical transistor 46 from turning on using the right trench wall 28 as a channel, a deep P-type implant region 22 is formed to raise the threshold voltage, $V_T$, of this region above the highest voltage that first gate 32 is charged to. Implant region 22 also provides a potential barrier against minority carriers from leakage current and soft error producing particles. This protection reduces any tendency for capacitor 26 to discharge. However, note that on the other side of the trench capacitor 26, the left side wall 28 is inverted to form channel 47 when first gate electrode 32 is charged. The p-type doping in this surface is set such that the threshold voltage is enhancement-like, i.e. greater than zero volts. If gate electrode 32 is not charged, held low at or near ground, then the left trench surface 28 (channel 47) is not inverted. Equivalently, the vertical transistor 48 on the left side of capacitor 26 is not turned on.

In order to read this cell 12, the first word line 60 is turned on and second bit line 64 is used as the "read" line. In other words, an attempt is made to bring the bit line 64 high. If the second vertical transistor 48 is turned off, the bit line 64 can go high, if FET 48 is turned on, current will flow through channels 47 and 54 and the bit line 64 will remain low, or current flow can be sensed. Now note that the first bit line 62 is used to write into the cell 12 shown in FIG. 1, and second bit line 64 is used to read this same cell 12. Second bit line 64 is also used to write into the adjacent cell 12 partially shown at the left of FIG. 1, to the left of second bit line 64, and first bit line 62 is also used to read the cell contents in the cell 12 to the right of first bit line 62 in FIG. 1. This dual use of bit lines 62 and 64 plus the use of the second vertical transistor 48, plus the avoidance of the need for a relatively large storage capacitor helps in making this a relatively high density DRAM cell.

Now it is also important to realize that when reading the cell 12, when the word line 60 is turned on, the first gate electrode 32 can discharge through first lateral transistor 34 which would cause the vertical transistor 48 to turn off when it was initially turned on. In order to avoid this, three options may be used. First, the word line 60 (gates 42 and 56) can have two different $V_T$s; the $V_T$ of second gate electrode 42 being higher than that of third gate electrode 56. Then when reading the cell 12, the word line 60 would be brought to a voltage between that of the two $V_T$s of gates 42 and 56. In this way third gate electrode 56 would be turned on and second gate electrode 42 would stay off.

A second approach is to have the $V_T$ of second gate electrode 42 appreciably above that of third gate electrode 56. Then for writing a 1 into the cell 12, that is, charging first gate electrode 32 positive, a booted or higher word line 60 voltage is used. For reading the cell 12 contents, a lower word line 60 voltage is used. A third approach to avoid discharging first gate electrode 32 during a read operation is to have two separate word lines to each cell 12, which, of course, has the disadvantage of increasing the cell 12 size. As will be described, the difference between using one word line and two word lines is schematically illustrated by comparing FIGS. 3 and 4.

Figure 2:
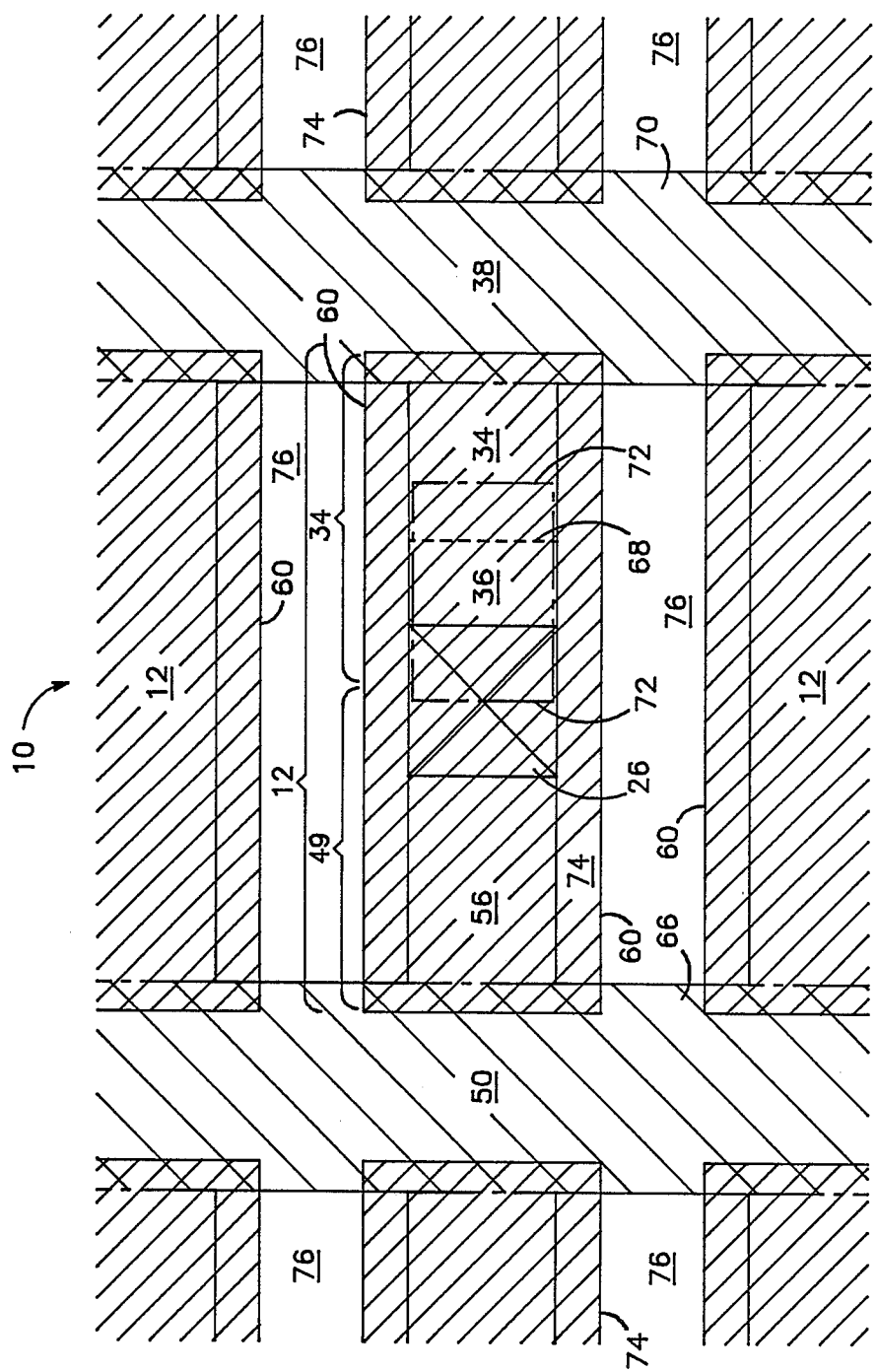
FIG. 2 is a plan layout view of the high density non-charge-sensing DRAM cell of the invention.

Shown in a FIG. 2 is one rough plan layout that might be made of the high density non-charge-sensing DRAM cell 12 of this invention. The same reference numerals are used to refer to the same elements discussed in FIG. 1. It should be noted that the layout illustrated in FIG. 2 is only one of many possible layouts that might be conceived given the instant invention, and that the FIG. 2 layout is not suggested as the optimal layout that might be devised. Located in the approximate center of the FIG. is a square representing the trench capacitor 26. N+ diffusion regions 66, 68 and 70 provide the second lateral FET 49's second source/drain region 50, first source/drain region 36 of first lateral transistor 34, and second source/drain region 38 of first lateral transistor 34, respectively. The connection of first gate electrode 32 to first source/drain region 36 of first lateral transistor 34 is provided by means of a buried contact or separate conductive layer 72 defined by the region outlined by the dot-dash line. In the cross section illustration of FIG. 1, the buried contact 72, which could be considered to be a second polycrystalline silicon layer or "second poly" layer if the capacitor 26 is filled with "first poly", overlaps the capacitor 26 considerably on the left side of the illustration. This overlap is not necessary to the invention and the left edge of the buried contact may be within the perimeter of the first gate electrode 32 as shown in FIG. 2.

Figure 4:
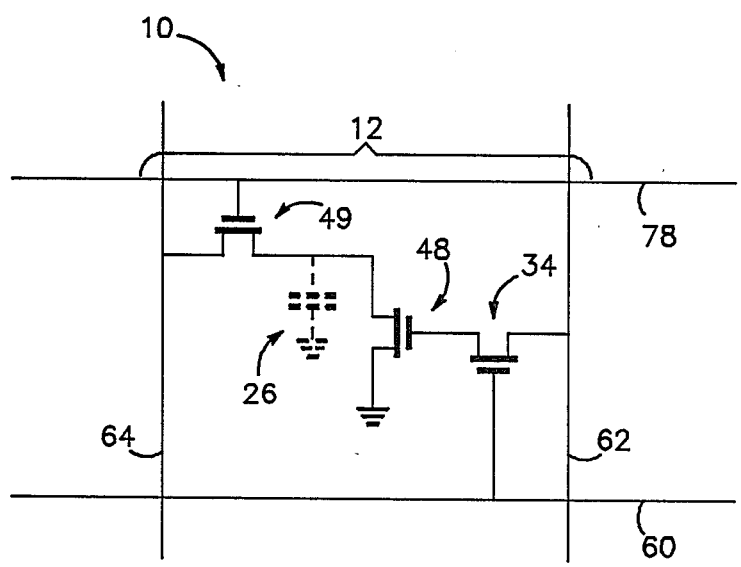
FIG. 4 is a schematic circuit diagram of another embodiment of the DRAM cell of this invention employing two word lines.

Further shown in FIG. 2 is the defined word line 60 as one piece of doped polycrystalline silicon or "third poly" 74. In the particular embodiment shown in FIG. 2, second gate electrode 34 and third gate electrode 56 are made from one piece of doped polycrystalline silicon 74. If the same threshold voltages are used for the lateral transistors 34 and 49, different word lines should be used as shown in FIG. 4 and in the cross section of FIG. 1, assuming, of course, that they would not be strapped together at 60 as shown therein. Other cells 12 are partially illustrated in FIG. 2. The cells are separated from one another by isolation regions, which may be field oxide regions 76.

Figure 3:
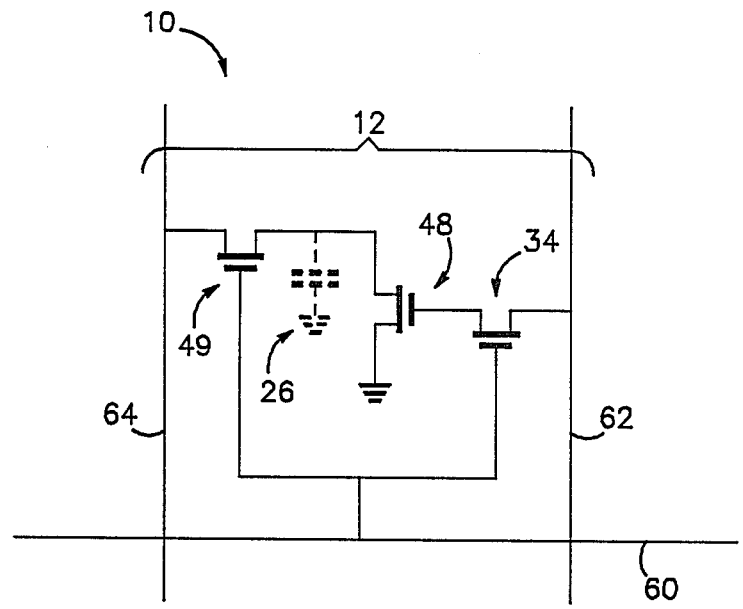
FIG. 3 is a schematic circuit diagram of one embodiment of the high density non-charge-sensing DRAM cell of the invention.

FIGS. 3 and 4 are schematic illustrations of the three-transistor DRAM cell shown and described elsewhere in this specification. The same reference numbers are used for corresponding elements. Vertical transistor 48 is illustrated in a vertical orientation in the FIGS. 3 and 4 to suggest its trench nature. Capacitor 26 is illustrated in dashed lines, since it is in fact already present and represented by the other transistors pictured. The only difference between FIGS. 3 and 4 is that one word line 60 is used in the circuit of FIG. 3 and two word lines 60 and 78 are used in FIG. 4. If the circuit of FIG. 4 is used, transistors 49 and 34 can have the same threshold voltages. Of course, one pays a penalty in silicon area used if two word lines 60 and 78 are employed.

It is anticipated that one skilled in the art could modify the invention described herein and still be within the scope of the appended claims. For example, if another means were employed to prevent the vertical transistor 46 from turning on other than by using implant region 22, the use of implant region 22 could be eliminated. In such an instance, discussion of a first vertical FET 46 would be unnecessary and second vertical FET 48 could be described as the only vertical FET.

I claim:

1. A high density non-charge-sensing dynamic random access memory (DRAM) cell in a semiconductor substrate comprising:
   a region of buried dopant within the substrate;
   a vertical trench capacitor extending into the substrate into contact with the region of buried dopant, the trench capacitor comprising:
     a trench wall forming a first plate electrode of the trench capacitor;
     a thin dielectric film covering the trench wall leaving a narrowed trench; and
     a first gate electrode of conductive material filling the narrowed trench and forming a second plate electrode of the trench capacitor;
   a first lateral field effect transistor (FET) in the substrate, the first lateral FET having first and second source/drain regions spaced apart from each other by a channel region which is covered by a second gate electrode insulated from the channel region, the first gate electrode of the trench capacitor being in electrical contact with the first source/drain region of the lateral FET;
   a second lateral FET adjacent the vertical trench capacitor, but spaced apart from the first lateral FET, the second lateral FET having a first source/drain region along the trench wall of the vertical trench capacitor and a second source/drain region in the substrate separated from each other by a channel region covered by a third gate electrode insulated from the channel; and
   a vertical FET on the trench wall of the capacitor adjacent the second lateral FET, the channel of the second lateral FET comprising a first source/drain region of the vertical FET, the first source/drain region of the second lateral FET comprising a channel of the vertical FET and the region of buried dopant comprising a second source/drain region of the vertical FET, wherein the first gate electrode comprises the gate electrode of the vertical FET separated from the channel by the thin dielectric film covering the trench wall.

2. The high density non-charge-sensing DRAM cell of claim 1 wherein the semiconductor substrate is monocrystalline silicon and the first gate electrode, second gate electrode and third gate electrode all consist of doped polycrystalline silicon.

3. The high density non-charge-sensing DRAM of claim 1 wherein the first and second source/drain regions of the first lateral FET and the second source/drain region of the second lateral FET are doped with an impurity.

4. The high density non-charge-sensing DRAM of claim 1 wherein the second gate electrode and the third gate electrode are electrically connected.

5. A high density non-charge-sensing dynamic random access memory (DRAM) cell comprising:
   on the semiconductor substrate doped with an impurity of a first conductivity type;
   a layer on the semiconductor substrate doped with an impurity of a second conductivity type;
   a vertical trench capacitor having sides, the capacitor extending through the layer into the substrate, the trench capacitor comprising:
     a trench wall forming a first plate electrode of the trench capacitor;
     a thin dielectric film covering the trench wall leaving a narrowed trench; and
     a first gate electrode of conductive material filling the narrowed trench, and forming a second plate electrode of the trench capacitor;
   a first lateral field effect transistor (FET) in the layer, the first lateral FET having first and second source/drain regions in the substrate spaced apart from each other by a channel region which is covered by a second gate electrode insulated from the channel region, the first gate electrode of the trench capacitor being in electrical contact with the first source/drain region of the lateral FET;
   a second lateral FET in the layer adjacent the vertical trench capacitor, but spaced apart from the first lateral FET, the second lateral FET having a first source/drain region along the trench wall of the vertical trench capacitor and a second source/drain region in the surface of the layer separated from each other by a channel region covered by a third gate electrode insulated from the channel; and
   a vertical FET in the layer on a side of the capacitor adjacent the second lateral FET, the channel of the second lateral FET comprising a first source/drain region of the vertical FET, the first source/drain region of the second lateral FET comprising a channel of the vertical FET and the semiconductor substrate comprising a second source/drain region of the vertical FET, wherein the first gate electrode comprises the gate electrode of the vertical FET separated from the channel by the thin dielectric film covering the trench wall.

6. The high density non-charge-sensing DRAM cell of claim 5 wherein the semiconductor substrate is monocrystalline silicon and the first gate electrode, second gate electrode and third gate electrode all consist of doped polycrystalline silicon.

7. The high density non-charge-sensing DRAM cell of claim 5 wherein the layer on the semiconductor substrate is an epitaxial layer of the second conductivity type grown on the semiconductor substrate.

8. The high density non-charge-sensing DRAM cell of claim 5 wherein the layer on the semiconductor substrate is a well of the second conductivity type in an epitaxial layer of the first conductivity type.

9. The high density non-charge-sensing DRAM of claim 5 wherein the first and second source/drain regions of the first lateral FET and the second source/drain region of the second lateral FET are doped with an impurity of the first conductivity type.

10. The high density non-charge-sensing DRAM of claim 5 wherein the second gate electrode and the third gate electrode are electrically connected.

11. A high density non-charge-sensing dynamic random access memory (DRAM) cell comprising:
    a semiconductor substrate doped with an impurity of a first conductivity type;
    a layer on the semiconductor substrate doped with an impurity of a second conductivity type;
    an implant region of the second conductivity type of limited lateral extent within the layer, the implant region having a perimeter edge;
    a vertical trench capacitor having sides, the capacitor extending into the substrate, the trench capacitor comprising:

a trench wall intersecting the implant region at a perimeter edge, the trench wall forming a first plate electrode of the trench capacitor;

a thin dielectric film covering the trench wall leaving a narrowed trench; and a first gate electrode of conductive material filling the narrowed trench and forming a second plate electrode of the trench capacitor;

a first lateral field effect transistor (FET) in the the layer positioned over the implant region, the lateral FET having first and second source/drain regions of the first conductivity type in the substrate spaced apart from each other by a channel region which is covered by a second gate electrode insulated from the channel region, the first gate electrode of the trench capacitor being in electrical contact with the first source/drain region of the lateral FET;

a first vertical FET in the layer along the side of the capacitor contacting the implant region, the first source/drain region of the lateral transistor comprising a first source/drain region of the first vertical FET, the semiconductor substrate comprising a second source/drain region of the first vertical FET, the trench wall between the first source/drain region and the second source/drain region comprising a channel, and the gate electrode of the trench capacitor comprising a gate electrode of the first vertical FET; wherein the implant region is present in the channel region of the first vertical FET causing first vertical FET to be off;

a second lateral FET in the layer adjacent the vertical trench capacitor, but spaced apart from the first lateral FET, the second lateral FET having a first source/drain region along the trench wall of the vertical trench capacitor and a second source/drain region in the surface of the layer separated from each other by a channel region covered by a third gate electrode insulated from the channel; and a second vertical FET in the layer on the side of the capacitor not contacting the implant region, the channel of the second lateral FET comprising a first source/drain region of the second vertical FET, the first source/drain region of the second lateral FET comprising a channel of the second vertical FET and substrate comprising a second source/drain region of the second vertical FET, further wherein the first gate electrode comprises a gate electrode to the second vertical FET separated from the channel by the thin dielectric film covering the trench wall.

12. The high density non-charge-sensing DRAM cell of claim 11 wherein the semiconductor substrate is monocrystalline silicon and the first gate electrode, second gate electrode and third gate electrode all consist of doped polycrystalline silicon.

13. The high density non-charge-sensing DRAM cell of claim 11 wherein the layer on the semiconductor substrate is an epitaxial layer of the second conductivity type grown on the semiconductor substrate.

14. The high density non-charge-sensing DRAM cell of claim 11 wherein the layer on the semiconductor substrate is a well of the second conductivity type in an epitaxial layer of the first conductivity type.

15. The high density non-charge-sensing DRAM of claim 11 wherein the first and second source/drain regions of the first lateral FET and the second source/drain region of the second lateral FET are doped with an impurity of the first conductivity type.

16. The high density non-charge-sensing DRAM of claim 11 wherein the second gate electrode and the third gate electrode are electrically connected.

17. A high density non-charge-sensing dynamic random access memory (DRAM) cell comprising:

a silicon substrate heavily doped with an impurity of a first conductivity type;

an epitaxial layer lightly doped with an impurity of the first conductivity type;

a well on the silicon substrate doped with an impurity of a second conductivity type;

an implant region heavily doped with an impurity of the second conductivity type and of limited lateral extent within the well, the implant region having a perimeter edge;

a vertical trench capacitor having sides, the capacitor extending into the substrate, the trench capacitor comprising:

a trench wall intersecting the implant region at the perimeter edge, the trench wall forming a first plate electrode of the capacitor;

a thin dielectric film covering the trench wall leaving a narrowed trench; and a first gate electrode of doped polycrystalline silicon material filling the narrowed trench and forming a second plate electrode of the trench capacitor;

a first lateral field effect transistor (FET) in the the well positioned over the implant region, the lateral FET having first and second source/drain regions heavily doped with an impurity of the first conductivity type in the substrate spaced apart from each other by a channel region which is covered by a second gate electrode insulated from the channel region, and first gate electrode of the trench capacitor being in electrical contact with the first source/drain region of the lateral FET;

a first vertical FET in the layer adjacent the capacitor contacting the implant region, the first source/drain region of the lateral transistor comprising a first source/drain region of the first vertical FET, the semiconductor substrate comprising a second source/drain region of the first vertical FET, the gate electrode of the trench capacitor comprising a gate electrode of the first vertical FET; and a channel existing between the first source/drain region and the second source/drain region wherein the implant region is present in the channel turning off the first vertical FET;

a second lateral FET in the layer adjacent the vertical trench capacitor, but spaced apart from the first lateral FET, the second lateral FET having a first source/drain region along the trench wall of the vertical trench capacitor and a second source/drain region in the layer separated from each other by a channel region covered by a third gate electrode insulated from the channel; and a second vertical FET in the layer on a side of the capacitor not contacting the implant region, the channel of the second lateral FET comprising a first source/drain region of the second vertical FET, the first source/drain region of the second lateral FET comprising the channel of the second vertical FET and the semiconductor substrate comprising a second source/drain region of the second vertical FET, further wherein the first gate electrode comprises the gate electrode to the second vertical FET separated from the channel by the thin dielectric film covering the trench wall.

* * * * *